United States Patent [19]

Lowe

[11] 4,172,259

[45] Oct. 23, 1979

[54] GRAPHIC RECORDING APPARATUS COMPENSATED FOR RECORD MEDIUM VELOCITY CHANGES

[75] Inventor: Peter R. Lowe, Colorado Springs, Colo.

[73] Assignee: Honeywell Inc., Minneapolis, Minn.

[21] Appl. No.: 860,780

[22] Filed: Dec. 15, 1977

[51] Int. Cl.² .................................................. G01G 15/14
[52] U.S. Cl. ................................. 346/110 R; 346/136
[58] Field of Search ....................... 346/110, 136, 108; 358/132, 216

[56] References Cited

U.S. PATENT DOCUMENTS

| 3,137,768 | 6/1964 | Mullin | 358/216 X |
|---|---|---|---|
| 3,434,158 | 3/1969 | Stauffer | 346/110 R |
| 3,482,255 | 12/1969 | Baker | 346/110 R |
| 3,764,737 | 10/1973 | Fischman | 358/216 X |

Primary Examiner—Joseph W. Hartary
Attorney, Agent, or Firm—Laurence J. Marhoefer; Lockwood D. Burton; George E. Bodenstein

[57] ABSTRACT

The beam of a line scan fiber optics cathode ray tube is intensity modulated and is repeatedly swept along the fiber optics strip of the tube by a horizontal deflection coil to place on a transversely moving record sheet recorded gray scale images which are representative of received data signals. A sheet velocity sensor, a frequency to voltage converter, and a differentiator produce a voltage signal proportional to short term sheet velocity errors, and an integrator converts that signal into a signal which represents the time integral of each of such errors. The integral signal controls a vertical deflection coil for the tube so that each of the sheet velocity errors is accompanied by a movement of the cathode ray tube beam in the vertical direction, and hence along the path of sheet travel. This vertical beam movement maintains the instantaneous relative velocity between the sheet and the beam substantially constant notwithstanding the short term sheet velocity errors. In this way, the density of the recorded images in the direction of sheet movement is substantially unaffected by the short term sheet velocity errors.

9 Claims, 1 Drawing Figure

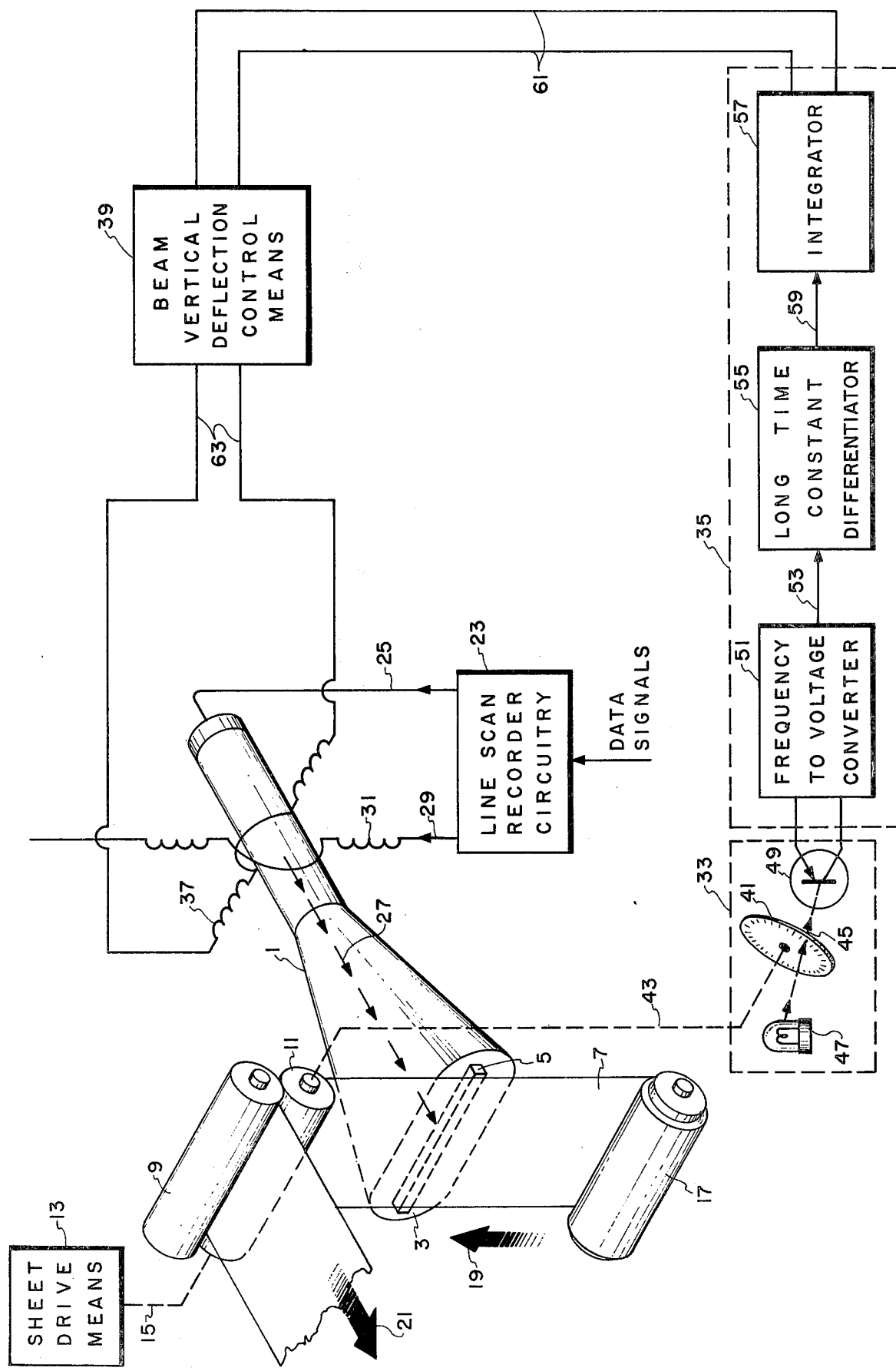

GRAPHIC RECORDING APPARATUS COMPENSATED FOR RECORD MEDIUM VELOCITY CHANGES

BACKGROUND OF THE INVENTION

1. Field Of The Invention

The present invention relates generally to graphic recording apparatus of the type wherein an elongated record medium or sheet is moved along a first path relative to a sheet-marking means or element, and wherein the latter is moved over a second or sheet marking path, which is substantially normal to the path of movement of the sheet, in order to cause the marking element to produce on the sheet a series of recorded transverse traces which make up a recorded image representing data supplied to the apparatus. The invention relates particularly to such apparatus wherein the marking element is in the form of a deflectable beam or other low inertia means, such as a laser beam or the beam of a cathode ray tube.

2. Description Of The Prior Art

In many forms and applications of recording apparatus of the type noted above, the quality and fidelity of the recorded images are dependent upon the steadiness or constancy of the velocity at which the record sheet is moved along its path relative to the marking element. An example of such recording apparatus wherein this constancy of sheet velocity is important is the recording apparatus which is arranged to operate in the so-called gray scale mode to produce so-called gray scale records or recorded images. In such apparatus, the intensity with which the marking element marks the sheet is controlled or modulated as the element is moved back and forth along its marking path, and the element and sheet velocities are so chosen that the recorded record appears as a varying density image or series of images which represent the data applied to the apparatus. An example of an important application for this form of apparatus is that in which the apparatus is used to produce recorded images of objects which are scanned by the known ultrasound scanning or imaging devices. A specific example of this form of recording apparatus is that wherein the marking element is the beam of a fiber optics cathode ray tube, wherein the record sheet is a light-sensitive sheet which is moved along its path of travel across and in contact with the fiber optics strip of the tube, and wherein the beam is moved back and forth along the fiber optics strip and is intensity modulated in accordance withe the data produced by the scanning device.

Although the record sheet moving or driving arrangements which have been developed for use with the above-described recording apparatus are capable of moving the record sheet at a sufficiently constant average velocity, those arrangements have been found to be incapable of preventing short term sheet velocity changes or velocity errors which occur due to the inevitable mechanical and electrical characteristics of the driving arrangements. Those short term velocity errors are such as to make the sheet movement sufficiently irregular that the amount of recording light falling on a given area of the sheet per unit time fluctuates to the extent that corresponding differences in the density of the final, developed recorded images are produced. Those density differences typically manifest themselves as strips across the sheet, which are generally regarded as undesirable. Attempts to smooth out the irregularities in the sheet movement to minimize the resulting image density differences by improving the sheet driving means have generally proved to be unsuccessful, due to the inherently high inertia of the mechanical parts involved.

SUMMARY OF THE INVENTION

Accordingly, it is an object of the present invention to provide improved recording apparatus which is not subject to the above-noted undesirable operation. Thus, it is a specific object of the invention to provide improved recording apparatus of the above-described type wherein compensation is effected for short term changes in the velocity of the record sheet so as to prevent such changes from degrading the quality of the recorded images.

To the end of accomplishing the above-noted and other desirable objects, the improved apparatus according to the invention includes means for sensing the instantaneous velocity of the record sheet, and includes means which are responsive to this sensed velocity for moving or shifting the marking element in a direction which is normal to its marking direction, and hence is along the path of movement of the sheet, to the extent necessary to prevent short term changes in the sheet velocity from changing the relative velocity between the element and the sheet. In this way, the instantaneous relative velocity between the sheet and the element along the path of movement of the sheet is maintained substantially constant at a normal value, whereby the density of the recorded images in the direction along the path of movement of the sheet is substantially unaffected by any short term sheet velocity changes.

BRIEF DESCRIPTION OF THE DRAWING

A better understanding of the present invention may be had from the following detailed description when read in connection with the accompanying drawing, wherein the single figure shows the application of the present invention to line scan recording apparatus of the fiber optics cathode ray tube type.

DETAILED DESCRIPTION

The Apparatus of the Drawing

The apparatus shown in the drawing illustrates a preferred example of the above-noted improved recording apparatus embodying the present invention. In this illustrated example, the invention is shown as being embodied in a line scan fiber optics cathode ray tube type of recording apparatus which is designed to produce gray scale recorded images representing data supplied to the apparatus, such as the data contained in signals applied to the apparatus from an ultrasound scanning device.

To this end, the illustrated recording apparatus includes a fiber optics cathode ray tube (FOCRT) 1 having a face 3 which supports the usual phosphor-backed fiber optics strip 5. A light-sensitive record sheet 7 is moved across and in contact with the face of the strip 5 by rollers 9 and 11. Roller 9 is an idler roller, and roller 11 is a sheet-moving or driving roller which is rotatively driven by a sheet drive means 13 by way of a mechanical linkage 15. The construction is such that the driven roller 11 pulls the sheet 7 from a sheet supply roll 17 upward over the strip 5 in the direction of the arrow 19. Thereafter, the sheet 7 is moved away from the apparatus in the direction of the arrow 21 to a suitable image processing or developing station, not shown. In its upward movement from the roll 17, the sheet 7 moves relative to the strip 5 along a vertical path of sheet movement or travel which is normal to the length of the strip 5. This sheet movement is made to take place at a substantially constant average velocity by using an appropriate constant speed means as the drive means 13, such as the known D.C. servo motor type of drive means which includes sheet velocity feedback means.

The illustrated apparatus also includes conventional line scan recorder circuitry 23 which receives the data signals which determine the form of the images to be recorded on the sheet 7. An output connection 25 from the circuitry 23 connects the latter to the conventional beam forming and intensity modulating portions, not shown, of the tube 1. As a result, the tube 1 produces the usual electron beam 27, which is intensity modulated in accordance with the images to be recorded on the sheet 7 as dictated by the data signals applied to the circuitry 23.

An output connection 29 from the circuitry 23 is connected to a horizontal deflection coil 31 for the tube 1. By means of the connection 29, the circuitry 23 causes the coil 31 to deflect or move the beam 27 of the tube 1 back and forth along the length of the strip 5 as necessary to produce the recorded images as dictated by the received data signals. Thus, the beam 27 is moved over a horizontal sheet marking path which is normal to the path of movement of the sheet 7.

Insofar as it has been described above, the illustrated recording apparatus is typical of the known forms of line scan fiber optics cathode ray tube recorders. However, according to the present invention, the illustrated apparatus includes novel means for effecting compensation for short term changes or errors in the velocity with which the sheet 7 moves along its path of travel, to the end of maintaining the instantaneous relative velocity between the sheet 7 and the beam 27 substantially constant along the path of sheet travel. This novel means includes a sensing means 33 for sensing the instantaneous velocity of the sheet 7 along its path of travel, and a signal producing means 35 which is responsive to the sheet velocity sensed by the means 33, and which produces a signal for appropriately deflecting or moving or positioning the beam 27 vertically, and hence along the path of sheet travel.

The signal produced by the means 35 effects such vertical movement of the beam 27 by way of a vertical deflection coil 37 and a beam vertical deflection control means 39. Thus, the coil 37 controls the movement and positioning of the beam 27 in a vertical direction or along a vertical path which will be referred to hereinafter as a compensating direction or path. This direction is normal to the horizontal marking direction or path of the beam along which the latter is moved by the coil 31, and is along the vertical path of movement of the sheet 7.

Specifically, the sheet velocity sensing means 33 includes an optical code wheel or light chopper 41 which is coupled by a suitable mechanical linkage 43 to the sheet driving roller 11. This construction is such that the wheel 41 rotates at a velocity which is proportional to the instantaneous rotational velocity of the roller 11 and to the instantaneous sheet velocity along its path of travel. The wheel 41 is positioned so that, when it is rotating, it periodically interrupts a light beam 45 which normally passes from a light source 47 to a light sensor, shown as a phototransistor 49.

Within the means 35, the output of the phototransistor 49 is connected to the input of a frequency to voltage converter 51. The output of the latter is connected by a connection 53 to the input of a differentiator 55 having a long time constant, which may be of the order of several seconds. The output of the differentiator 55 is connected to the input of an integrator 57 by a connection 59. The output of the integrator 57, which is the output of the means 35, is connected to the input of the vertical deflection control means 39 by conductors 61. Finally, the output of the means 39 is connected by conductors 63 to the vertical deflection coil 37.

THE OPERATION OF THE APPARATUS OF THE DRAWING

In describing the typical operation of the illustrated apparatus, the conventional actions performed by the apparatus in producing images on the sheet 7 will be described first. To this end, it is noted that the circuitry 23 responds to the received data signals and, in accordance therewith, applies corresponding control signals to the horizontal deflection coil 31 and the beam intensity modulating means of the tube 1. This is done by way of the respective connections 29 and 25. In response to those signals, the coil 31 causes the beam 27 to move or scan back and forth over its horizontal marking path along the strip 5 with the appropriate intensity variations as dictated by the received data signals. Those beam intensity variations are such that each marking passage of the beam along its marking path produces a corresponding recorded line of appropriate densities on and across the sheet 7. The upward movement of the latter along its vertical path of travel at its above-noted substantially constant average velocity or normal velocity causes the recorded lines to combine to form on and along the sheet 7 the appropriate gray scale images dictated by the received data signals.

The novel operation of the illustrated apparatus in accordance with the present invention will now be described by means of a typical operating example. In this example, let it first be assumed that the instantaneous velocity of the sheet 7 along its path of travel, and hence the instantaneous relative velocity between the sheet 7 and the beam 27, is constant at its normal value and is without short term or momentary changes. Under these conditions, the photo transistor 49 applies to the frequency to voltage converter 51 a pulse signal of a constant frequency which is proportional to the normal sheet velocity. The converter 51 responds to said pulse signal to provide to the differentiator 55 a voltage signal which is proportional to the sheet velocity. Since this velocity is assumed to be constant at the present time, there is now no output signal from the differentiator 55, and hence no output signal on the conductors 61 from the integrator 57.

Under the conditions just noted, the beam vertical deflection control means 39 is arranged to so energize the vertical deflection coil 37 that the beam 27 is held at a fixed position in its vertical or compensating direction as it deflects back and forth along its horizontal path of marking movement. On the further assumption that the instantaneous sheet velocity has been constant up to this time, it is correspondingly assumed that the vertical position of the beam 27 in the compensating direction is its so-called base position, which means that the beam 27 is deflecting back and forth along the strip 5 on a base horizontal marking line which is preferably midway between the top edge and the bottom edge of the strip 5. This is considered to be the normal or undeflected position of the beam 27 in the compensating direction.

Let it now be assumed that the sheet velocity experiences a short term increase or positive velocity error. This means that the instantaneous sheet velocity rises above its normal value and then returns to that value, all in a very short period of time. Thus, the instantaneous sheet velocity is higher than normal for this brief period. During that period, the relative velocity between the sheet 7 and the strip 5 is likewise higher than normal, with the result that, in the absence of the compensating means according to the present invention, irregularities or defects in the recorded images would be produced as explained hereinbefore.

Since the frequency of the signal applied to the converter 51 is proportional to the instantaneous sheet velocity, that frequency and the output voltage of the converter 51 on the connection 53 rise and fall with respect to their normal values as the sheet velocity rises and falls with respect to its normal value throughout the duration of the assumed sheet velocity error. That is, the signal on the connection 53 follows or tracks the instantaneous sheet velocity. The differentiator 55 removes the portion of the last-noted signal which corresponds to the normal sheet velocity, and so converts that signal to one which is proportional to only the velocity error. This velocity error signal appears on the connection 59, and is applied to the integrator 57.

The integrator 57 now produces on the output conductors 61 an output signal which is the time integral of the velocity error signal. This means that the output signal now appearing on the conductors 61 represents the direction, extent and duration of the velocity error. The effect of this output signal on the beam 27, by way of the means 39 and the coil 37, is to move the beam 27 and its marking line upward in the compensating direction as long as the integral signal is changing, and hence as long as the sheet velocity is above its normal value. Moreover, the output signal so moves the beam 27 upward that its instantaneous rate of vertical movement equals the instantaneous value of the sheet velocity error, whereby the instantaneous relative velocity between the sheet 7 and the beam 27 is not changed or affected by the sheet velocity error, as is desired.

When the sheet velocity error has disappeared, the output or integral signal on the conductors 61 remains at the value proportional to the time integral of the velocity error signal which was present on the connection 59. As a result, the beam 27 remains deflected in the compensating direction at the level which it reached at the time at which the sheet velocity error disappeared. Thereafter, the beam 27 continues its horizontal moving and marking operation along a new horizontal marking line on the strip 5 which is correspondingly above the above-noted base line.

The beam 27 continues to have its marking movement along its new, vertically displaced marking line along the strip 5 until another sheet velocity error occurs. If this velocity error should be another momentary velocity increase, the above described operation would be repeated, and the beam 27 would thereafter be horizontally moving along a still higher marking line on the strip 5.

It has been found in practice, however, that each short term sheet velocity increase is generally followed by a short term velocity decrease or negative velocity error. Continuing with the description of the typical operation of the apparatus, therefore, it is now assumed that such a momentary sheet velocity decrease, below the normal sheet velocity, occurs some time after the above-described momentary velocity increase. Thus, the instantaneous sheet velocity is now longer than normal for a brief period.

During the last-noted period, the voltage on the connection 53 falls and rises with respect to its normal value as the instantaneous sheet velocity falls and rises with respect to its normal value. Again, the differentiator 55 converts the voltage on the connection 53 to a velocity error signal, on the connection 59, which signal now is of opposite polarity with respect to its previous condition corresponding to a short term sheet velocity increase.

Again, the integrator 57 responds to the velocity error signal. Now, however, the opposite polarity of the latter causes the integrator output signal on the conductors 61 to decrease from its previous value throughout the duration of the short term sheet velocity decrease.

The effect of the last-noted output signal decrease is to cause the beam 27 to move downward in its compensating direction as long as the sheet velocity is below its normal value, to the end that the instantaneous relative velocity between the sheet 7 and the beam 27 is kept at its normal value throughout the period of the negative sheet velocity error. When the latter has disappeared, the signal on the conductors 61 keeps the beam 27 moving along its horizontal marking path on a new, lower marking line on the strip 5. This new line corresponds to the new, lower vertical position which the beam 27 reaches at the time at which the negative sheet velocity error disappears. This new line may be above or below the original base line, depending on the aggregate of the extents, durations, and directions of the sheet velocity errors which have occurred up to this time.

As the sheet 7 continues to experience the noted short term positive and negative velocity errors, the beam 27 and its horizontal marking line move up and down on the strip 5 to corresponding new vertical levels in compensating for such errors. Since the average sheet velocity is constant, however, the average of the sheet velocity errors is zero. Consequently, the beam 27 and the horizontal marking lines along which it moves remain within a working range somewhere between the upper and lower edges of the strip 5. In practice, this range may cover a band on the strip 5 which is only 0.03 inches wide, which is a dimension that is well within the width of 0.2 inches of the usual fiber optics strip window. Such a dimension for the maximum travel or excursions of the beam 27 in the compensation direction also permits the slow vertical shifting of the beam for phosphor life extending purposes as disclosed in the Lowe U.S. Pat. No. 3,700,955.

Although the compensation effected by the above described vertical positioning of the beam 27 is useful for many forms and types of record sheet material, it is particularly useful when the record sheet is of one of the known types having a gray scale. An example of this type of record sheet which is particularly benefited by the described compensating movement of the beam 27 is that which is heat-developed and which uses an electrically-conductive backing layer to facilitate the production of the developing heat.

If desired, the velocity sensing means 33 may also be used as the sheet velocity feedback means which would normally be employed in the sheet drive means 13 in keeping the average sheet velocity constant. Further, if desired, the roller 11 may be used solely to drive the sensing means 33, and the sheet 7 may then be driven by a separate set of driving rollers which are driven by the means 13. It is advantageous, in any case, to have the roller which drives the sensing means 33 as close as possible to the strip 5.

Although the compensating operation according to the present invention has been described herein, by way of example, as being applied to a marking means which is in the form of a cathode ray tube beam, it should be understood that the invention is applicable also in those situations wherein the marking means is of some other sufficiently low inertia type. The criterion is that the marking means be capable of being moved in the direction normal to the marking direction sufficiently rapidly to produce the desired compensating action for the short term sheet velocity errors at hand.

It is believed to be clear from the foregoing description that the apparatus according to the invention fulfills the objects stated herein. Thus, it has been shown that such apparatus causes the marking means to so track the record sheet movement that short term changes in the sheet velocity do not disturb the normal relative velocity existing between the marking means and the sheet, and hence do not produce undesirable effects in the recorded images.

The embodiments of the invention in which an exclusive property or privilege is claimed are defined as follows:

1. In graphic recording apparatus including means for moving a record medium along a first path relative to a medium-marking means at a substantially constant average velocity, and including means for moving said marking means over a second path which is substantially normal to said first path to cause said marking means to produce a recorded image on said medium, the improvement comprising means coupled at said medium and responsive to the instantaneous velocity of said medium along said first path, including means for producing a signal which represents solely short term changes in said velocity, and coupled to said marking means for moving the latter along said first path in response to said signal to the extent and in the direction necessary to maintain a substantially constant instantaneous relative velocity between said marking means and said medium along said first path notwithstanding said short term changes in the instantaneous velocity of said medium from a constant average velocity, whereby the density of said recorded image to the direction along said first path is substantially unaffected by said short term velocity changes.

2. In graphic recording apparatus including means for moving a record medium along a first path relative to a medium-marking means at a substantially constant average velocity, and including means for moving said marking means over a second path which is substantially normal to said first path to cause said marking means to produce a recorded image on said medium, the improvement comprising sensing means responsive to said movement of said medium along said first path for sensing the instantaneous velocity of said medium along said first path, signal producing means coupled to said sensing means and responsive to said sensed velocity for producing a signal which is representative of solely the direction, extent, and duration of short term changes in said sensed velocity from said constant average velocity, and deflection control means coupled to said signal producing means and to said marking means and responsive to said signal for moving said marking means along said first path in a direction, at a rate, and for a time dependent upon said signal to maintain the instantaneous relative velocity between said medium and said marking means along said first path substantially constant notwithstanding said short term changes in said sensed velocity, whereby the density of said recorded image in the direction along said first path is substantially unaffected by said short term velocity changes.

3. In graphic recording apparatus including means for moving a record medium along a first path relative to a medium-marking means at a substantially constant average velocity, and including means for moving said marking means over a second path which is substantially normal to said first path to cause said marking means to produce a recorded image on said medium, the improvement comprising sensing means responsive to said movement of said medium along said first path for sensing the instantaneous velocity of said medium along said first path, signal producing means coupled to said sensing means and responsive to said sensed velocity for producing a velocity error signal which is representative of solely the difference between said instantaneous and average velocities of said medium, integrating means coupled to said signal producing means and responsive to said error signal for producing an integral signal of a magnitude which represents the time integral of said error signal, and deflection control means coupled to said integrating means and to said marking means and responsive to said integral signal for positioning said marking means along said first path in accordance with the magnitude of said integral signal to maintain the instantaneous relative velocity between said medium and said marking means along said first path substantially constant notwithstanding short term changes in said sensed velocity from said average velocity, whereby the density of said recorded image in the direction along said first path is substantially unaffected by said short term velocity changes.

4. Apparatus as specified in claim 3, wherein said sensing means produces a pulse signal of a frequency which is representative of said instantaneous velocity, said signal producing means includes a frequency to voltage converter for receiving said pulse signal and converting the latter into a velocity voltage signal which is representative of said instantaneous velocity, and said signal producing means also includes a long time constant differentiator for receiving said velocity signal and converting the latter into said velocity error signal.

5. In graphic recording apparatus including means for moving a record medium along a first path relative to the face of a cathode ray tube at a substantially constant average velocity, and including means for moving the beam of said tube over a second path which is substantially normal to said first path to cause said beam to produce a recorded image on said medium, the improvement comprising sensing means responsive to said movement of said medium along said first path for sensing the instantaneous velocity of said medium along said first path, signal producing means coupled to said sensing means and responsive to said sensed velocity for producing a signal which is representative of soley the direction, extent, and duration of short term changes in said sensed velocity from said constant average velocity, and beam deflection control means coupled to said signal producing means and to said beam and responsive to said signal for moving said beam along said first path in a direction, at a rate, and for a time dependent upon said signal to maintain the instantaneous relative velocity between said medium and said beam along said first path substantially constant notwithstanding said short term changes in said sensed velocity, whereby the density of said recorded image in the direction along said first path is substantially unaffected by said short term velocity changes.

6. In graphic recording apparatus including means for moving a record medium along a first path relative to the face of a cathode ray tube at a substantially constant average velocity, and including means for moving the beam of said tube over a second path which is substantially normal to said first path to cause said beam to produce a recorded image on said medium, the improvement comprising sensing means responsive to said movement of said medium along said first path for sensing the instantaneous velocity of said medium along said first path, signal producing means coupled to said sensing means and responsive to said sensed velocity for producing a velocity error signal which is representative of solely the difference between said instantaneous and average velocities of said medium, integrating means coupled to said signal producing means and responsive to said error signal for producing an integral signal of a magnitude which represents the time integral of said error signal, and beam deflection control means coupled to said integrating means and to said beam and responsive to said integral signal for positioning said beam along said first path in accordance with the magnitude of said integral signal to maintain the instantaneous relative velocity between said medium and said beam along said first path substantially constant notwithstanding short term changes in said sensed velocity from said average velocity, whereby the density of said recorded image in the direction along said first path is substantially unaffected by said short term velocity changes.

7. In graphic recording apparatus including means for moving a light-sensitive record sheet along a sheet travel path relative to and across the fiber optics strip of a fiber optics cathode ray tube at a substantially constant average velocity, and including first beam deflection control means for moving the beam of said tube over a marking path which is substantially normal to said sheet travel path and which is along the phosphor coating on the inboard side of said strip, thereby to cause said beam to produce a recorded image on and along said sheet, the improvement comprising sensing means responsive to said movement of said sheet along said sheet travel path for sensing the instantaneous velocity of said sheet along the last-mentioned path, signal producing means coupled to said sensing means and responsive to said sensed velocity for producing a velocity error signal which is representative of solely the difference between said instantaneous and average velocities of said sheet, integrating means coupled to said signal producing means and responsive to said error signal for producing an integral signal of a magnitude which represents the time integral of said error signal, and second beam deflection control means coupled to said integrating means and to said beam and responsive to said integral signal for positioning said beam along a compensating path which is substantially normal to said marking path and which is hence along said sheet travel path, the position of said beam along said compensating path with respect to a datum position being determined by the magnitude of said integral signal, whereby the instantaneous relative velocity between said sheet and said beam along said sheet travel path is maintained substantially constant, notwithstanding short term changes in said sensed velocity from said average velocity, to prevent the density of said recorded image along said sheet travel path from being affected by said short term velocity changes.

8. Apparatus as specified in claim 7, wherein said tube includes beam intensity control means which are actuated along with said first beam deflection control means to cause said beam to produce said images as gray scale images.

9. Graphic recording apparatus, comprising drive means arranged to move a record medium along a medium travel path, said drive means including medium velocity feedback means for causing said drive means to move said medium along said medium travel path at a substantially constant average velocity, medium-marking means located along said medium travel path in marking relationship to said medium, first moving means coupled to said marking means for moving the latter along a medium marking path which is substantially normal to said medium travel path to cause said marking means to produce a recorded image on said medium, second moving means coupled to said marking means for moving the latter along said medium travel path, and compensating means coupled to said medium and responsive to the instantaneous velocity of said medium along said medium travel path, including means for producing a signal which represents solely short term changes in said velocity, and coupled to said second moving means for positioning said marking means along said medium travel path in response to said signal to maintain a substantially constant instantaneous relative velocity between said medium and said marking means along said medium travel path, whereby the density of said recorded image in the direction of said medium travel path is substantially unaffected by said short term changes in said instantaneous velocity of said medium from said constant average velocity.

* * * * *